US009698318B2

(12) United States Patent
Amo

(10) Patent No.: US 9,698,318 B2
(45) Date of Patent: Jul. 4, 2017

(54) LIGHT EMITTING DEVICE

(71) Applicant: NICHIA CORPORATION, Anan-shi (JP)

(72) Inventor: Takahiro Amo, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/663,456

(22) Filed: Mar. 20, 2015

(65) Prior Publication Data

US 2015/0280082 A1 Oct. 1, 2015

(30) Foreign Application Priority Data

Mar. 28, 2014 (JP) ................................. 2014-067685
Jan. 19, 2015 (JP) ................................. 2015-007975

(51) Int. Cl.
*H01L 33/62* (2010.01)
*H01L 33/50* (2010.01)
(Continued)

(52) U.S. Cl.
CPC .......... *H01L 33/507* (2013.01); *H01L 33/483* (2013.01); *H01L 33/505* (2013.01); *H01L 33/52* (2013.01); *H01L 33/54* (2013.01); *H01L 33/62* (2013.01); *H01L 2224/45144* (2013.01); *H01L 2224/49171* (2013.01); *H01L 2224/97* (2013.01); *H01L 2924/181* (2013.01); *H01L 2924/1815* (2013.01); *H01L 2933/005* (2013.01); *H01L 2933/0033* (2013.01);
(Continued)

(58) Field of Classification Search
CPC ................................. H01L 33/48; H01L 33/62
See application file for complete search history.

(56) References Cited

U.S. PATENT DOCUMENTS

| 6,486,543 B1 | 11/2002 | Sano et al. |
| 2006/0027479 A1 | 2/2006 | Auburger et al. |

(Continued)

FOREIGN PATENT DOCUMENTS

| CN | 102795005 | 11/2012 |
| DE | 102010021791 | 12/2011 |

(Continued)

OTHER PUBLICATIONS

Extended European Search Report for corresponding EP Application No. 15159847.1-1551, Jul. 29, 2015.

*Primary Examiner* — Jae Lee
(74) *Attorney, Agent, or Firm* — Mori & Ward, LLP

(57) ABSTRACT

A light emitting device includes a base member, a light emitting element, and a sealing member. The substrate includes a wiring portion. The element is arranged on or above the substrate. The sealing member covers the element, and at least a part of the substrate. The sealing member includes a wavelength conversion member. The part of the substrate is divided into first and second sections by a straight line that passes through the center of the part as viewed in plan view. The wiring portion is arranged so that its area on the first section side is larger than on the second section side. The element is arranged so that its area in the second section is larger than the first section. The height of the sealing member on the second section side is greater than on the first section side.

27 Claims, 4 Drawing Sheets

(51) Int. Cl.
*H01L 33/48* (2010.01)
*H01L 33/52* (2010.01)
*H01L 33/54* (2010.01)

(52) U.S. Cl.
CPC ............... *H01L 2933/0041* (2013.01); *H01L 2933/0066* (2013.01)

(56) References Cited

U.S. PATENT DOCUMENTS

| | | | |
|---|---|---|---|
| 2008/0224161 A1* | 9/2008 | Takada | H01L 33/486 |
| | | | 257/98 |
| 2012/0104436 A1 | 5/2012 | Ng et al. | |
| 2013/0001618 A1* | 1/2013 | Imai | H01L 33/486 |
| | | | 257/98 |
| 2013/0092966 A1 | 4/2013 | Jaeger et al. | |
| 2013/0126935 A1* | 5/2013 | Zitzlsperger | H01L 33/486 |
| | | | 257/99 |
| 2013/0307014 A1* | 11/2013 | Yamamoto | H01L 33/62 |
| | | | 257/99 |
| 2014/0151734 A1 | 6/2014 | Ito et al. | |
| 2015/0140706 A1 | 5/2015 | Chen et al. | |

FOREIGN PATENT DOCUMENTS

| | | |
|---|---|---|
| EP | 1622237 | 2/2006 |
| JP | 11-330131 | 11/1999 |
| JP | 2008-41841 | 2/2008 |
| JP | 2008-270786 | 11/2008 |
| JP | 2009-87681 | 4/2009 |
| JP | 2009-147281 | 7/2009 |
| WO | WO 2013/011628 | 1/2013 |

\* cited by examiner

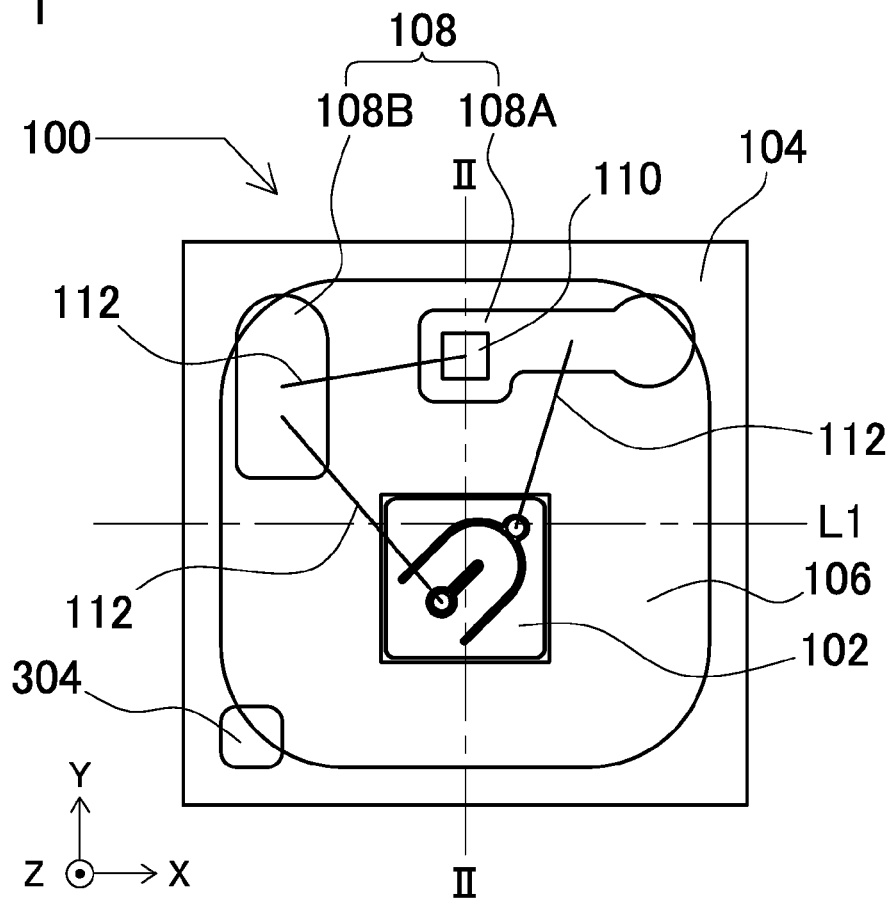
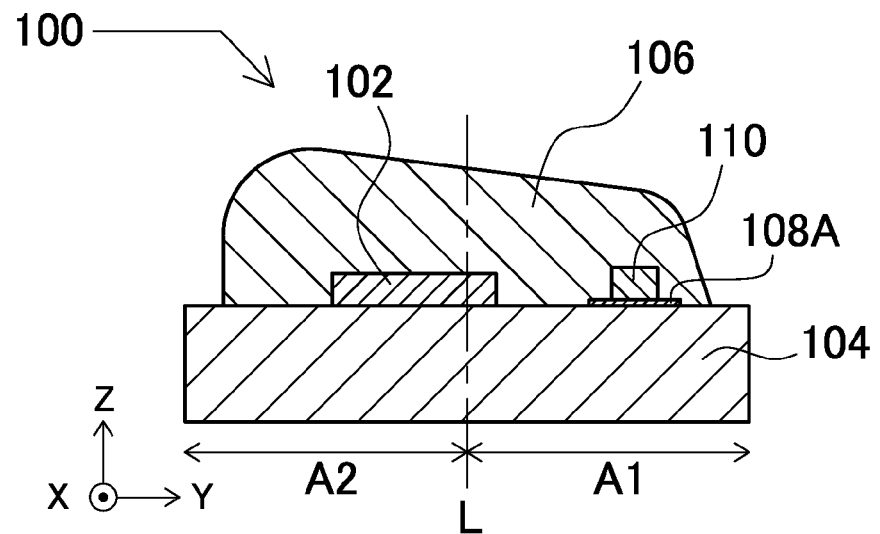

LIGHT EMITTING DEVICE

CROSS-REFERENCE TO RELATED APPLICATIONS

The present application claims priority under 35 U.S.C. §119 to Japanese Patent Application No. 2014-67,685 filed on Mar. 28, 2014, and Japanese Patent Application No. 2015-007975 filed on Jan. 19, 2015. The contents of these applications are incorporated herein by references in their entirety.

BACKGROUND OF THE INVENTION

1. Field of the Invention

This disclosure relates to a light emitting device.

2. Description of the Related Art

Light emitting devices for emitting white light are known which include a light emitting element that emits blue light, and a fluorescent material that is excited by absorbing a part of the blue light and emits light with a wavelength longer than the blue light.

It is required for these light emitting devices to provide uniform color tone in all light emitting directions, and to increase luminous intensity.

For example, International Publication No. WO 2013-011,628 A1 discloses a light emitting device which includes a first layer that includes a wavelength conversion material, and a second layer that includes a light diffusion material and is arranged on the first layer, in order to reduce color unevenness.

However, in the case where light diffusion materials are used, there may be a problem that the light diffusion materials reduce light outgoing efficiency.

This disclosure is aimed at the above problem, and its object is to provide a light emitting device that can reduce color unevenness and has high light outgoing efficiency.

SUMMARY OF THE INVENTION

A light emitting device according to one aspect of the present invention includes a base member, a light emitting element, and a sealing member. The base member includes a wiring portion. The light emitting element is arranged on or above the base member. The sealing member covers the light emitting element, and at least a part of the base member. The sealing member includes a wavelength conversion member. The part of the base member, which is covered by the sealing member, is divided into first and second sections by an imaginary straight line that passes through the center of the part as viewed in plan view. The wiring portion is arranged so that its area on the first section side is larger than on the second section side. The light emitting element is arranged so that its area on the second section side is larger than on the first section side. The height of the sealing member on the second section side is greater than on the first section side.

A method for producing a light emitting device according to one aspect of the present invention includes preparing a substrate that includes a plurality of base members arranged in an array, placing a mask that has a plurality of openings on the substrate, placing a sealing member onto the upper surface side of the mask, moving a squeegee from one side toward another side of the mask whereby filling the openings with the sealing member, and removing the mask. Each of the base members has first and second sections that are defined by dividing the base member by an imaginary straight line that passes through its center as viewed from the upper surface side. Each of the base members includes a wiring portion, and a light emitting element. The wiring portion is arranged so that its area in the first section is larger than in the second section. The light emitting element is arranged so that its area in the second section is larger than in the first section. The sealing member includes a wavelength conversion member. The squeegee is moved from the first section side toward the second section side.

A light emitting device that can reduce color unevenness and has high light outgoing efficiency can be provided by the aforementioned features in this disclosure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a schematic top view showing a light emitting device according to an embodiment of the present invention;

FIG. 2 is a schematic cross-sectional view showing the light emitting device according to the embodiment of the present invention;

DESCRIPTION OF THE EMBODIMENTS

Figure 3:
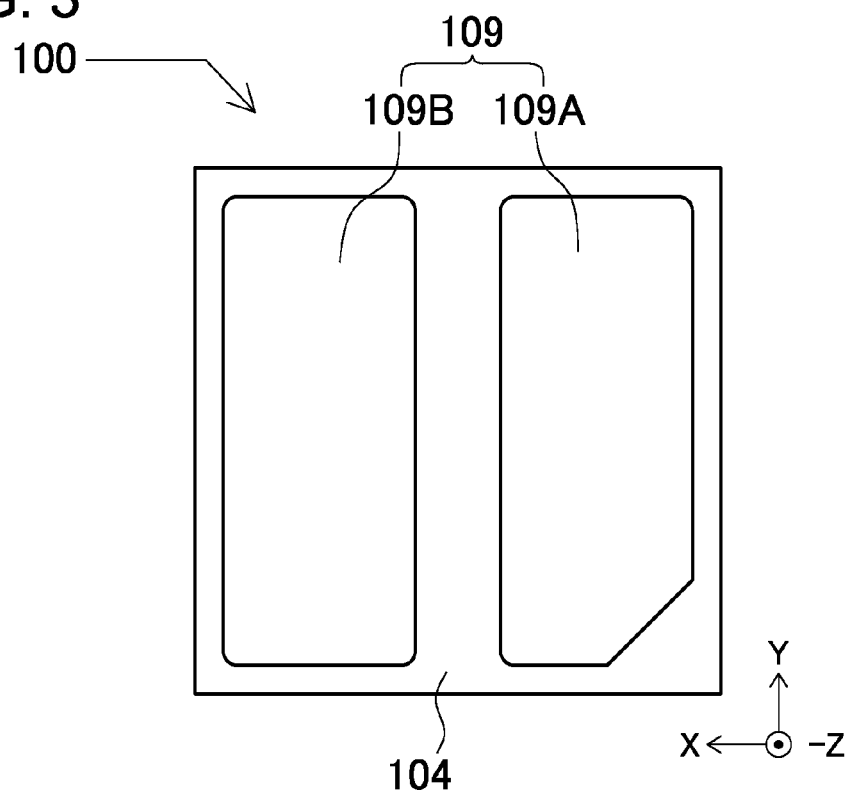
FIG. 3 is a schematic bottom view showing the light emitting device according to the embodiment of the present invention.

The embodiments will now be described with reference to the accompanying drawings, wherein like reference numerals designate corresponding or identical elements throughout the various drawings. It should be appreciated that the embodiments described below are illustrations of technical ideas of the present invention, and the present invention is not specifically limited to these embodiments. Additionally, the sizes and the arrangement relationships of the members in each of the drawings are occasionally shown larger exaggeratingly for ease of explanation. The "x", "y", and "z" directions shown in the drawings are occasionally referred to as the "width", "length", and "vertical" or "thickness (height)" directions, respectively.

EMBODIMENT(S)

FIG. 1 is a schematic top view showing a light emitting device 100 according to an embodiment of the present invention. FIG. 2 is a schematic cross-sectional view of the light emitting device taken along the line II-II shown in FIG. 1. FIG. 3 is a schematic bottom view of the light emitting device shown in FIG. 1.

The light emitting device 100 according to the embodiment of the present invention includes a base member 104 that includes a wiring portion 108, a light emitting element 102 that is arranged on or above the base member 104, and a sealing member 106 that covers the light emitting element 102 and includes a wavelength conversion member.

The base member 104 serves as a mount member on which the light emitting element 102 is mounted. The wiring portion 108, which is arranged on the surface of the base member 104, is constructed of electrically-conductive members for supplying electric power to the light emitting element 102. The wiring portion 108 is arranged on one side of the base member 104 deviated from the center line as viewed in plan view.

Figure 4:
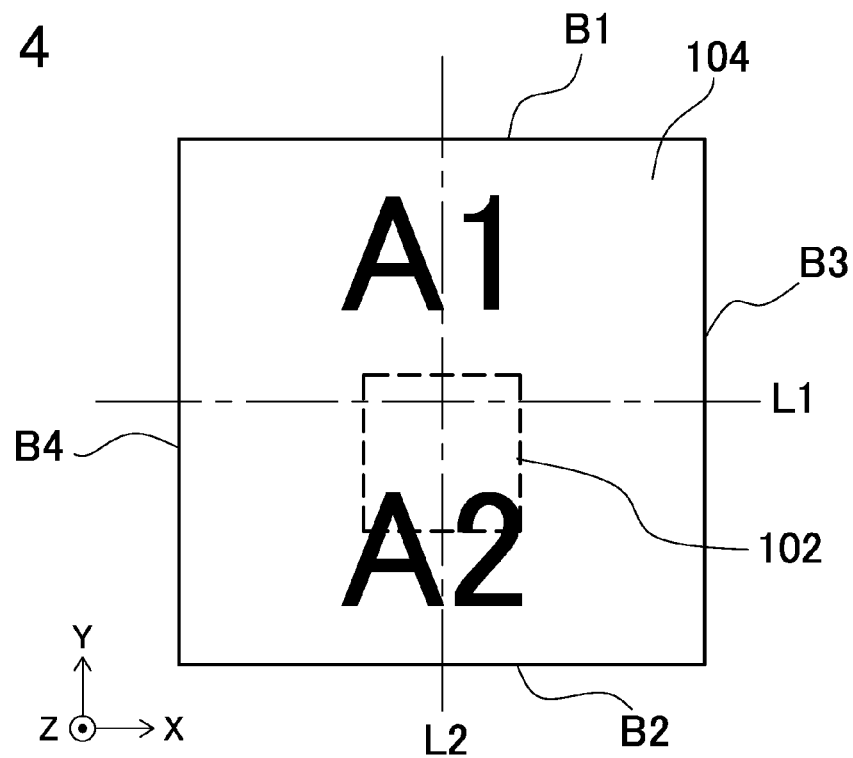
FIG. 4 is a schematic top view for illustrating the light emitting device according to the embodiment of the present invention.

FIG. 4 is a schematic top view for illustrating the light emitting device 100 shown in FIG. 1. The base member 104 and the light emitting element 102 according to this embodiment have rectangular shapes as viewed in plan view. The base member 104 has sides B1 to B4. The sides B1 and B2 are substantially parallel to each other, and extend in the x direction. Also, the sides B3 and B4 are substantially parallel to each other, and extend in the y direction. In this embodiment, the lengths of the sides B1 to B4 are equal, that is, the base member 104 has a square shape as viewed in plan view.

Here, as shown in FIG. 4, if an imaginary straight line L1 is defined which passes through the midpoints of the sides B3 and B4 and extends in the x direction (in other words, the straight line L1 passes through the center of the light-emitting-element mounting surface), the light-emitting-element mounting surface of the base member 104 can be divided into two sections A1 and A2 by the straight line L1. The section A1 has side B1, while the section A2 has the side B2. Hereinafter, in this specification, the sections A1 and A2 are occasionally referred to as first and second sections, respectively.

As shown in FIG. 4, the wiring portion 108 is formed on the one side (section A1 side) of the base member 104, while the light emitting element 102 is located in both the sections A1 and A2 but the most part of the light emitting element is arranged in the section A2 as viewed in plan view. That is, the wiring portion 108 is arranged so that its area on the section A1 side (first section side) is larger than on the section A2 side (second section side), while the light emitting element 102 is arranged so that its area on the section A2 side (second section side) is larger than on the section A1 side (first section side). In other words, the center of the light emitting element 102 is offset toward the section A2 side with respect to the center of the base member 104 so that the light emitting element is arranged away from the wiring portion 108, or shifted toward a side of less-crowded wiring portion 108.

The most parts of the surfaces of the wiring portion 108 are covered by the sealing member 106. The reflectivity of the wiring portion 108 cannot be 100% for the light emitted by the light emitting device. Accordingly, it is unavoidable that the light is absorbed by the surfaces of the base member 104 and the wiring portion 108. In particular, in the case where the reflectivity of the wiring portion 108 (hereinafter, the reflectivity refers to a reflectivity at the wavelength of the light emitted by the light emitting device, i.e., the wavelength of the light emitted by the light emitting element or the wavelength conversion member) is smaller than the reflectivity of the base member 104, as the light emitting element 102 is positioned closer to the wiring portion 108, the absorption of the light absorbed by the wiring portion 108 increases, and the light outgoing efficiency reduces. It is conceivable that the reduction of light outgoing efficiency can be suppressed by using silver with high reflectivity as the material of a surface layer of the wiring portion 108. However, there is a problem that silver may be tarnished by sulfuration. For this reason, it is preferable to use gold, which is not subjected to sulfuration. On the other hand, in the case of where a blue light emitting element is used to construct a white LED, the reflectivity of gold is smaller than the reflectivity of silver.

To address this, in this embodiment, gold is used as the material of the surface layer of the wiring portion 108, while the light emitting element 102 is deviated toward the section A2 side away from the wiring portion 108. According to this arrangement, the light absorption can be suppressed. On the other hand, since the light emitting element 102 is offset with respect to the center of the base member 104, when the light passes through the sealing member 106, the lengths of paths of the light become different from each other depending on the light-outgoing directions. Correspondingly, when light passing through the sealing member 106 and the wavelength of the light is converted by the wavelength conversion member, each of optical length varies depending on the light-outgoing direction and the converted amounts of the light also become different from each other accordingly. There will be another problem that the color becomes uneven.

According to this embodiment, the height of the sealing member 106 is set greater on the side where the light emitting element 102 is located than the side where the wiring portion 108 is located, in other words, the height of the sealing member on the section A2 side is set greater than the section A1 side. As a result, the distances from the light emitting element 102 to the periphery of the sealing member 106 can be even in respective directions. According to this, when the wavelength of the light is converted, the converted amounts of the light can be also even irrespective of the lower (thinner) side and higher (thicker) side of the sealing member 106. Consequently, color unevenness can be reduced. That is, the highest part of the sealing member 106 is located in the section A2 but not in the section A1 where a larger part of the wiring portion is located.

In this embodiment, as shown in FIG. 1, although the light emitting element 102 is offset in the y direction of the base member, the light emitting element is arranged at the center of the base member in the x direction. That is, as shown in FIG. 4, if an imaginary straight line L2 is defined which passes through the midpoints of the sides B1 and B2 and extends in the y direction, the center of the light emitting element is positioned on the straight line L2 as viewed in plan view. Dissimilar to the y direction, preferably, the sealing member does not have height difference in the x direction, in other words, the sealing member is symmetrically formed with respect to the straight L2 line as the symmetry axis in the cross-sectional view taken along a line perpendicular to the line L2.

The following description will describe a light emitting device 100 according to a preferred form of this embodiment.

(Base Member 104)

The base member 104 is not specifically limited as long as it can serve as a mount member on which the light emitting element 102 can be mounted. It is preferable that the base member have a plate shape. The reason is that the sealing member 106 having an upper surface with different heights can be easily formed on such a plate-shaped base member. However, the base member may have a recessed portion in a part where the light emitting element 102 is placed.

It is preferable that the material of the base member 104 be an inorganic material which is less likely to deteriorate. In particular, the material of the base member is preferably ceramics. Examples of ceramics materials can be provided by alumina, mullite, forsterite, aluminum nitride (AlN), silicon carbide (SiC), low temperature co-fired ceramics (LTCC), and the like. In particular, ceramics that contains alumina is preferably used. The reason is that it is inexpensive and less likely to be cracked.

In addition, it is preferable that the base member 104 be formed of a porous material which has numbers of pores and is produced by coupling parts of grains of an inorganic material (e.g., alumina, yttria, zirconia, titania, diamond, calcium oxide, and barium sulfate) to each other. According to this structure, the reflectivity can be improved by the refractive index difference between air and such an inorganic material. For example, the base member preferably has a reflectivity not less than 80%, more preferably not less than 85% at 450 nm wavelength.

In addition to ceramics, materials usable in this embodiment can be provided by resins. Examples of such resin materials may be formed from thermoplastic resins such as aliphatic polyamide resin, semi-aromatic-polyamide resin, polyethylene terephthalate, polycyclohexane terephthalate, liquid crystal polymer, polycarbonate resin, syndiotactic polystyrene, polyphenylene ether, polyphenylene sulfide, polyether sulfone resin, polyether ketone resin and polyarylate resin, and thermosetting resins such as polybismaleimide triazine resin, epoxy resin, silicone resin, modified silicone resin, modified epoxy resin, polyimide resin, polyurethane resin and phenol resin.

Although the base member 104 has been illustratively described which has a square outside shape as viewed in plan view in this embodiment, the base member is not limited to this. The base member may have rectangular or polygonal outside shape.

(Wiring Portion 108)

The wiring portion 108 is formed on the surface of the base member 104. The wiring portion 108 is not specifically limited as long as it is constructed of an electrically-conductive material for supplying electric power to the light emitting element 102. Since the wiring portion 108 absorbs the light, it is preferable that the size of the wiring portion be enough to provide electrical connection but be as small as possible. It is only required for the wiring portion to include at least a pair of anode and cathode terminals. The wiring portion according to this embodiment consists of two wiring parts 108A and 108B.

In the case where ceramics is used for the base member 104, the wiring portion 108 is formed as a metal layer. For example, a metal layer of a high melting-point metal can be formed on the surface of the base member 104, and the base member with the metal layer can be entirely burned by the co-firing method so that the wiring portion is formed. Also, various kinds of paste can be applied on the base member 104 which is produced by sintering, and the base member with the paste can be burned by the post firing method. Also, a pattern may be formed by using a dry film resist or by etching, or the like, after a metal layer is formed on the surface of the base member. At this time, as shown in FIG. 3, terminals 109 of the light emitting device can be formed on the opposite side of the light emitting element mounting surface (i.e., the back surface of the base member 104). The terminals 109 can be connected to the wiring portion 108 by using through holes, vias or the like which pass through the base member 104, for example. Alternatively, electrically-conductive members can be formed which pass along the side surface of the base member 104 so that the terminals can be connected to the wiring portion. In this embodiment, the wiring portion 108A is electrically connected to the terminal 109A, while the wiring portion 108B is electrically connected to the terminal 109B.

Examples of the materials of the wiring portion to be formed on the ceramics can be provided by metals that mainly contains Ni, Au, Cu, Ag, Pd, Rh, Pt, Sn and the like, and alloys of any of them. The wiring portion can be formed by forming a layer of the material on the base member. More specifically, the wiring portion can be formed by forming the layer by vapor deposition, sputtering, print processes, or the like, and additionally by plating the layer. It is preferable to use a metal that mainly contains Au as the top surface layer of the wiring portion 108. The reason is that Au is less likely to deteriorate, and has good adhesion to wires.

On the other hand, in the case where a resin is used as the material of the base member 104, a prepreg with the resin being half-cured can be thermally cured after a metal plate is attached onto the prepreg. Subsequently, the metal plate can be patterned into a desired shape by photolithography, or the like whereby forming the wiring portion. Additionally, the surface of the metal plate may be plated.

In addition, marks for positioning and for indicating electrical polarity may be formed in the process where the wiring portion is formed. In this embodiment, a cathode mark 304 is formed in the corner part in the section A2 where the wiring portion 108 is not arranged.

(Light Emitting Device 102)

The light emitting element 102 is placed on the base member 104. The light emitting element 102 is adhered onto the base member 104 by an adhesive, and is electrically connected to the wiring portion 108 by wires 112. For example, a semiconductor light emitting element such as an LED element can be used as the light emitting element 102. The light emitting element 102 generally includes a transparent substrate, semiconductor layers that are deposited on the transparent substrate, and a pair of positive and negative electrodes that are formed on the semiconductor layers. The light emitting element may be arranged on the wiring portion 108 instead of the base member 104.

The light emitting element 102 can emit ultraviolet light or visible light. In the case where the light emitting device emits white light, it is preferable that the light emitting element 102 be a blue light element that emits light with a wavelength falling within the range from 400 nm or more to 530 nm or less, more preferably from 420 nm or more to 490 nm or less. In the case where the blue light element is used together with a yellow phosphor as the after-mentioned wavelength conversion member, a white light emitting device can be produced. It is preferable that the blue light emitting element be a nitride semiconductor group ($In_xAl_yGa_{1-x-y}N$, $0 \leq x$, $0 \leq y$, $x+y \leq 1$) light emitting element, which can efficiently excite the phosphor. The number of the light emitting elements 102 to be mounted on the single light emitting device 100 can be one, or two or more. In particular, in the case where the number of the light emitting elements is one, unbalance of light emission area could be significant. From this viewpoint, according to this embodiment, the effect of suppressing color unevenness will be remarkable in the case where the light emitting element is single. Also, in the case where the area of the light emitting element is large as viewed in plan view, unbalance of light emission area could be significant. For this reason, in the case where the light emitting element has a side with a length not shorter than 500 μm as viewed in plan view for example, according to this embodiment, the effect will be also remarkable.

The light emitting element 102 according to this embodiment is positioned other than the wiring portion 108. The light emitting element is also mounted in a so-called face-up mounting manner. The electrodes of the light emitting element are electrically connected to the wiring portion 108 by the wires 112.

In addition to the light emitting element, as shown in FIG. 1, a protection element 110, or the like can be provided.

(Wire 112)

The wires 112 electrically connect the light emitting element 102 to the wiring portion 108. The wires 112 can be metal wires formed of Au, Cu, Ag, Pt, Al or the like, or an alloy of any of them. In particular, it is preferable that the wires 112 be Au wires, which are resistance to disconnection due to a stress from the sealing member, and are good in thermal resistance, and the like. Alternatively, in order to increase the outgoing efficiency of the light, the wire 112 may include Ag, or an alloy of Ag as at least a surface layer.

(Adhesive)

The adhesive serves to fix the light emitting element 102 onto the base member 104 or the wiring portion 108. As the adhesive, an electrically insulating or conductive adhesive can be suitably selected depending on the purpose. The electrically insulating adhesive can be epoxy resin, silicone resin, polyimide resin, modified resin obtained by modifying any of them, and hybrid resin containing at least two of these resins.

(Sealing Member 106)

The sealing member 106 is not specifically limited as long as it is electrically insulating, allows the light emitted from the light emitting element 102 to pass through it, and has flowability before cured. The sealing member preferably has a transmittance of not less than 70%. Examples of the transparent resins can be provided by silicone resin, modified silicone resin, epoxy resin, phenol resin, polycarbonate resin, acrylate resin, TPX resin, polynorbornene resin, hybrid resin containing one or more kinds of these resins, and the like. In particular, it is preferable that the sealing member be formed of silicone resin. The reason is that silicone resin has good heat resistance and good light resistance, and that the volumetric shrinkage of silicone resin is small after solidified.

Although the height (thickness) of the sealing member can be any suitable value, the height (thickness) of the sealing member preferably falls within the range from 300 to 700 µm, more preferably from 400 to 600 µm. The color unevenness problem will be more evident as the sealing member becomes thinner. From this point, for example, in the case where the thickness of the sealing member is not greater than 500 µm, the effect of the construction of the light emitting device according to this embodiment can be more remarkable. Here, the "height" refers to the height (z direction) from the surface of the base member 104, and the aforementioned values of the thickness refer to the height of the highest part of the sealing member.

It is preferable that the sealing member have a curved surface and a convex shape which bulges toward the light-outgoing surface side as shown in FIG. 2. In order to minimize the total reflection of the light from the light emitting element 102, it is preferable that the upper surface of the sealing member be not parallel to the surface of the base member 104. Alternatively it is preferable that the partial area of the upper surface that are parallel to the surface of the base member be 70% or smaller of the entire upper surface of the sealing member.

Although the sealing member 106 according to this embodiment has been described as a single layer, the sealing member may include two or more layers. For example, a layer which directly covers the light emitting element 102 may not include the wavelength conversion member, while another layer which is arranged on that layer, which directly covers the light emitting element, may include the wavelength conversion member. In this specification, a member which does not directly cover the light emitting element but indirectly covers the light emitting element and can convert the light from the light emitting element into light having a different wavelength is also referred to as the sealing member 106.

(Wavelength Conversion Member)

The sealing member 106 includes the wavelength conversion member, which is excited by at least a part of the light emitted by the light emitting element 102, and emits light having a wavelength different from the light of the light emitting element.

Typical examples of the wavelength conversion members can be provided by phosphors and quantum dots.

(Phosphor)

The wavelength conversion member can be one, or two or more kinds of phosphors. Any kind of known phosphor used for LEDs can be employed. The two kinds of phosphors can be used which are first and second phosphor having different particle sizes and different luminescent radiation colors, for example. In the case where two or more kinds of phosphors having different luminescent colors are used, the color reproduction range and the color rendering property can be improved.

As the phosphors, for example, as yellow to green phosphors, a yttrium aluminum garnet group phosphor (YAG group phosphor) and a lutetium aluminum garnet group phosphor (LAG group phosphor) can be used. As green phosphors, a chlorosilicate phosphor and a β-SIALON phosphor can be used, for example. As red phosphors, SCASN group phosphors such as (Sr, Ca)AlSiN$_3$:Eu, CASN group phosphors such as CaAlSiN$_3$:Eu, SrAlSiN$_3$:Eu phosphor, KSF group phosphors such as K$_2$SiF$_6$:Mn, and the like can be used.

Although the particle size of the phosphor is not specifically limited, it preferably falls within the range from about 2 to 50 µm, more preferably from 5 to 20 µm. In addition, as the particle size of the phosphor becomes larger, the light outgoing efficiency of the light emitting device tends to be higher, but the color unevenness tends to be greater.

The sealing member 106 can include additives such as filler and diffusion materials in addition to the aforementioned wavelength conversion member. Examples of the diffusion materials can be provided by SiO$_2$, TiO$_2$, and the like.

In this embodiment, LAG is used as first phosphor, and SCASN is used as second phosphor. According to this construction, the light emitting device can have high color rendering properties.

(Production Method of Light Emitting Device 100)

An exemplary production method of the light emitting device 100 according to a first embodiment is now described with reference to the drawings. FIGS. 5, 6A, 6B, and 6C are schematic perspective and cross-sectional views showing the exemplary production method of the light emitting device 100 according to the first embodiment. The production method of the light emitting device 100 according to the first embodiment is only required to include at least a process of forming the sealing member 106, which includes the wavelength conversion member, on the base member 104 on which the light emitting element 102 is placed. The production method of the light emitting device according to the present invention is not limited to the production method described below.

Figure 5:
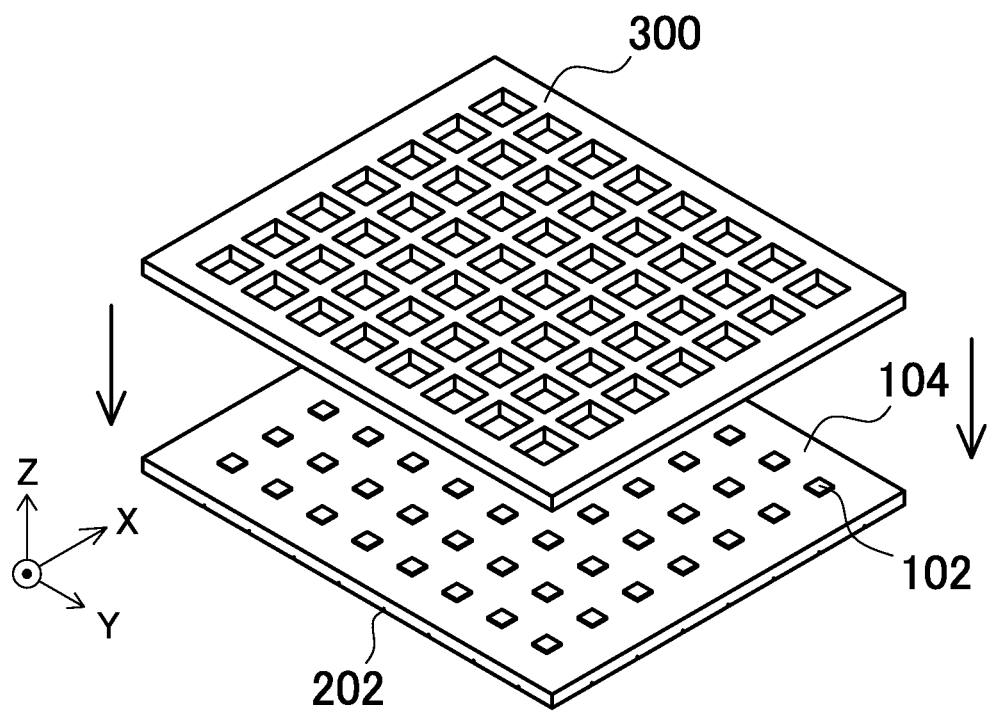
FIG. 5 is a diagram for illustrating a method for producing a light emitting device according to an embodiment of the present invention.

The base members 104 used in this embodiment are included in a plate-shaped substrate as shown in FIG. 5. The substrate includes a plurality of base members 104, which are arranged in an array or arrays. In this embodiment, the substrate has grooves 202 that extend along lines for dividing the substrate into the base members 104. The grooves 202 can be formed on the back surface side of the base members as shown in FIG. 5, or may be formed on the upper surface. According to this construction, the substrate can be easily divided into the base members by the substrate along the grooves. It should be noted that the groove 202 may not be necessary.

The base member 104 corresponding to each piece as one light emitting device includes the light emitting element 102. The center of the light emitting element 102 is offset from the center of the base member 104 as viewed in plan view. This substrate is prepared, and then a mask 300 with openings is placed so that one sealing member can be formed in each of the light emitting devices 100 as shown in FIG. 5.

Figure 6A:
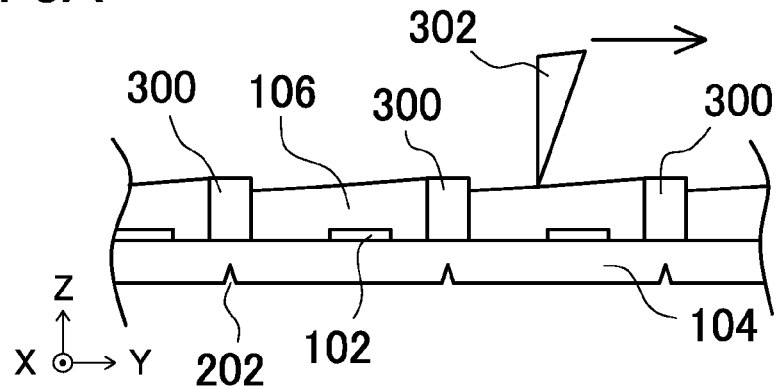
FIGS. 6A to 6C are diagrams for illustrating the method for producing a light emitting device according to the embodiment of the present invention.

Subsequently, the sealing member including the wavelength conversion member is placed on the upper side of the mask 300. After that, as shown in FIG. 6A, a squeegee 302 is moved from one side toward another side of the mask 300 (in the direction shown by the arrow in FIG. 6A) so that the openings are filled with the sealing member 106 (printing). Thus, the light emitting element 102 is covered by the sealing member 106.

Figure 6B:
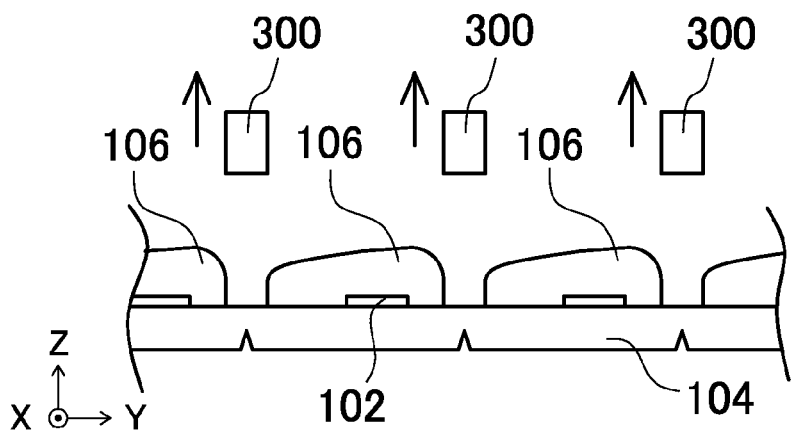

The moving direction of the squeegee 302 is the offset direction of the light emitting element 102. According to this, the amount of the sealing member 106 can be greater on the side toward which the light emitting element is offset. After that, the mask 300 is removed as shown in FIG. 6B. As a result, when the sealing member 106 is formed, the height of the sealing member 106 on the light emitting element 102 side can be greater than the height of the sealing member 106 on another side.

Figure 6C:
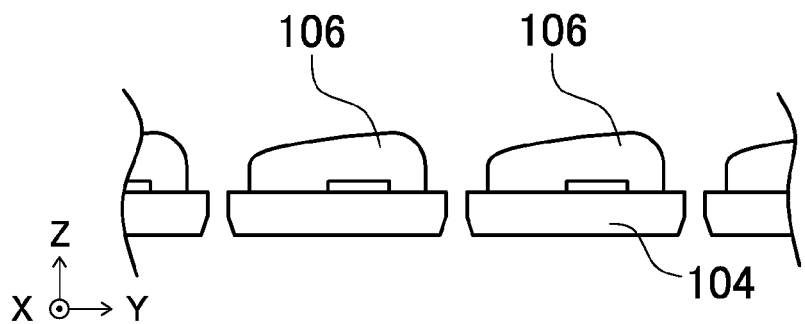

Finally, the light emitting devices 100 can be produced by breaking the substrate along the grooves 202 as shown in FIG. 6C. The division method is not limited to the breaking method, but may be conducted by a laser or dicing division method.

Although the light emitting element has been described which is offset toward one side on the base member as viewed in plan view in the foregoing embodiment, needless to say, the light emitting element may be offset toward a corner of the base member. In this case, the wiring portion 108 is arranged in the corner part that is diagonally opposite to the corner part where the light emitting element is arranged. The height of the sealing member 108 in one corner part is greater than in the corner part that is diagonally opposite to the one corner part.

EXAMPLE(S)

The following description will describe an example according to the present invention with reference to the drawings. The substrate is first prepared. The substrate to be prepared includes a plurality of base members 104. In other words, the substrate is separated into a plurality of base members 104, and unseparated substrate is sets of base members 104. The base members are arranged in an array on the substrate. The substrate is divided into the base members in the later process. Each of the base members 104 can have a 1.85×1.85 mm substantially rectangular shape as viewed in plan view, and a height of 0.38 mm, for example. The upper surface of each of the base member 104 can be divided into the sections A1 and A2 by the straight line L1 which passes through the midpoints of the sides B3 and B4 as discussed above. The base members 104 are arranged so that their sections A1 and A2 face the same side in the substrate.

The wiring portion 108 and the light emitting element 102 are arranged on the upper surface of each of the base members 104. In this example, one light emitting element 102, and the positive and negative wiring parts 108 are provided. The light emitting element 102 can be used which has a size of 0.55 mm×0.55 mm as viewed in plan view, and a height of 0.15 mm, for example. The width of the wiring portion 108 can be 0.2 mm, which is about 10% of the upper surface of the base member.

In this example, the wiring portion 108 is arranged in the section A1. The center of the light emitting element 102 can be offset by 0.18 mm from the center of the upper surface of the base member toward the section A2 side as viewed in plan view. Thus, although a part of the light emitting element 102 is arranged in the section A1, the most part of the light emitting element is arranged in the section A2 as viewed in plan view. The clearance between the light emitting element 102 and the wiring portion 108 can be 0.31 mm, for example. The light emitting element 102 and the wiring portion 108 are electrically connected to each other by the wires. In this example, the protection element 110 which has a size of 0.15×0.15 mm as viewed in plan view and a height of 0.1 mm may be arranged on the wiring portion 108, for example.

The mask 300 with the openings is placed onto the substrate, which includes the base members 104 arranged in an array. The openings are formed in the locations of the mask 300 corresponding to the base members in the substrate. For example, the mask 300 can be used which has a plurality of openings having a size of 1.6×1.6 mm as viewed in plan view and a height of 0.4 mm. The openings are spaced at an interval 0.25 mm from each other, for example. The height of the sealing member 106 can be greater in the moving direction of the squeegee 302 as the size of the opening be smaller in the process of filling the openings with the sealing member 106 (discussed below). In addition, the mask 300 preferably has a surface roughness falling within the range from about 0.2 to 0.3 µm. In the case where the mask 300 has a high surface roughness, the height difference of the sealing member 106 is likely to be greater which will be created in the process of removing the mask 300 from the sealing member 106. In the case where the mask 300 is subjected to surface treatment, the sealing member 106 can be prevent from spreading to parts of the mask other than the openings. For example, the mask is preferably coated with a hard film.

A dimethyl silicone (viscosity from 100 to 300 Pa·S) which includes the wavelength conversion member is placed on the mask 300. Subsequently, the squeegee 302 is moved from one side toward another side of the mask 300, in other words, toward the section A2 side so that the openings are filled with the sealing member 106 (printing) by the squeegee 302. Thus, each of the light emitting elements 102 is covered by the sealing member 106. According to this, as for the sealing member 106 in each opening, the amount of the sealing member 106 can be greater on the moving direction of the squeegee 302 (i.e., on the section A2 side). That is, the height of the sealing member 106 is to be greater on the section A2 side on which the light emitting element 102 is placed as compared with on the section A1 side, in each opening.

The height of the sealing member 106 can be greater in the moving direction of the squeegee 302 as the viscosity of the sealing member 106 for printing is greater. In the case where the squeegee 302 has a J-shaped end for example, the amount of the sealing member 106 on the moving direction of the squeegee 302 can be increased. In addition, in the case where the squeegee 302 is inclined toward the moving direction when being moved, the amount of the sealing member 106 on the moving direction of the squeegee 302 can be further increased. The movement speed of the squeegee 302 and the pressure of the squeegee 302 on the sealing member are not specifically limited. For example, the movement speed of the squeegee 302 can fall within the range from 1 to 50 mm/s.

Subsequently, the mask 300 is removed. In the case where the removal speed of the mask 300 from the sealing member 106 is high, the height difference of the sealing member 106 between the sections A1 and A2 can be large. For example, in this example, in the case where the removal speed of the mask 300 is 0.1 mm/s, the height difference of the sealing member 106 between the sections A1 and A2 can be 50 to 70 µm.

As discussed above, after the mask 300 is removed, the sealing member 106 can be formed on each of the base members 104 so that the height of the sealing member 106 on the section A2 side (i.e., light emitting element 102 side) is greater than the height of the sealing member 106 on the section A1 side (i.e., wiring portion 108 side).

The sealing member 106 on each of the base members has an outside shape with sizes of 1.3 mm×1.3 mm on the upper surface side, and 1.5×1.5 mm on the bottom surface, which is the base member side, as viewed in plan view, for example. The height (thickness) of the sealing member is 0.5 mm, for example. The height of the sealing member on the section A2 side is greater by 50 to 70 µm than the section A1 side. For example, the angle that is formed by the bottom and side surfaces of the sealing member 106 is 60°, while the corner part between the upper and side surfaces is rounded. In addition, the distance between the light emitting element 102 and the periphery of the sealing member 106 can be about 0.26 mm, for example.

After that, the substrate with the sealing member 106 is divided into pieces by the aforementioned method. As a result, the light emitting devices 100 can be produced. In the light emitting device 100, the periphery of the sealing member 106 (on the bottom surface side) is positioned inward of the periphery of the base member 104 as viewed in plan view. The distance between the peripheries of the sealing member and the base member can be 0.12 mm.

Although the sealing member 106 of the light emitting device 100 has been described which is formed by printing in the foregoing example, the present invention is not limited to this. For example, the sealing member may be formed by potting, or the like. More specifically, the aforementioned mask 300 is similarly placed on the substrate, and the sealing member is placed in the openings by potting, or the like. Subsequently, the substrate and the mask 300 are inclined toward the section A2 side with the mask 300 being held on the substrate. According to this, the sealing member 106 placed in each opening flows toward the section A2 side so that the height of the sealing member can be greater on the section A2 side, in which the light emitting element 102 is placed. After that, the mask 300 is removed, and the substrate with the sealing member is divided into pieces. As a result, the aforementioned light emitting devices 100 can be similarly produced.

Also, the sealing member 106 may be formed by using a mold in a transfer or compression molding manner. More specifically, the mold to be used is designed to form the sealing member 106 which has a height on the section A2 side (light emitting element side) greater than on the section A1 side in each of the base members. In this case, the height of the sealing member 106 can be more accurately controlled.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:
1. A light emitting device comprising:
a base member;
anode and cathode wiring islands made of electrically-conductive members arranged on the base member such that a non-wiring portion is formed on the base member;
a light emitting element that is arranged on the non-wiring portion of an upper surface of said base member in a non-overlapping manner relative to an entirety of said anode and cathode wiring islands on said base member as viewed in plan view and is electrically connected to each of said anode and cathode wiring islands by wires; and
a sealing member that covers said light emitting element, at least a part of said base member, and said anode and cathode wiring islands, and includes a wavelength conversion member,
wherein the part of said base member and said anode and cathode wiring islands, which are covered by said sealing member, are divided into first and second sections by a straight line that passes through the center of said sealing member as viewed in plan view,
wherein said anode and cathode wiring islands are arranged so that the area of said anode and cathode wiring islands in said first section is larger than in said second section,
wherein said light emitting element is arranged so that the area of the light emitting element in said second section is larger than in said first section, and
wherein the height of said sealing member at a position in said second section is greater than at a position in said first section.

2. The light emitting device according to claim 1, wherein said light emitting element is arranged other than said anode and cathode wiring islands, and is electrically connected to said anode and cathode wiring islands by said wires.

3. The light emitting device according to claim 1, wherein said anode and cathode wiring islands have a reflectivity lower than said base member at the wavelength of light emitted by said light emitting device.

4. The light emitting device according to claim 1, wherein said wavelength conversion member includes two or more kinds of phosphors.

5. The light emitting device according to claim 1, wherein the thickness of said sealing member is not greater than 500 µm.

6. The light emitting device according to claim 1, wherein a protection element is arranged on or above said anode and cathode wiring islands, and said protection element is electrically connected to said anode and cathode wiring islands.

7. The light emitting device according to claim 1, wherein said light emitting element, which is arranged on said base member, is single.

8. A method for producing said light emitting device according to claim 1, the method comprising:
preparing a substrate that includes a plurality of said base members arranged in an array, each of the base members having said first and second sections that are defined by dividing the base member by said imaginary straight line that passes through the center of the base member as viewed from the upper surface side, and including said wiring portion that is arranged so that the area of said wiring portion in said first section is larger than that in said second section, and said light emitting element that is arranged so that the area of said light emitting element in said second section is larger than that in said first section;
placing a mask that has a plurality of openings on said substrate, placing said sealing member that includes said wavelength conversion member onto the upper surface side of said mask, and moving a squeegee from one side toward another side of said mask whereby filling said openings with said sealing member; and
removing said mask,
wherein said squeegee is moved from said first section side toward said second section side on each of said base members so that an amount of said sealing member is greater on said second section side than that on said first section side.

9. The method for producing a light emitting device according to claim 8 further comprising dividing said substrate into individual light emitting devices.

10. The method for producing a light emitting device according to claim 9, wherein said substrate is divided along grooves that are formed on said substrate.

11. The light emitting device according to claim 1, wherein the sealing member is configured to form an upper surface where a partial area being parallel to a surface of the base member constitutes 70% or smaller of an entire upper surface of the sealing member.

12. The light emitting device according to claim 1, wherein the height difference of the sealing member between the first section and the second section is 50 to 70 µm.

13. The light emitting device according to claim 2, wherein said anode and cathode wiring islands have a reflectivity lower than said base member at the wavelength of light emitted by said light emitting device.

14. The light emitting device according to claim 13, wherein said wavelength conversion member includes two or more kinds of phosphors.

15. The light emitting device according to claim 14, wherein the thickness of said sealing member is not greater than 500 µm.

16. The light emitting device according to claim 15, wherein a protection element is arranged on or above said anode and cathode wiring islands, and said protection element is electrically connected to said anode and cathode wiring islands.

17. The light emitting device according to claim 16, wherein said light emitting element, which is arranged on said base member, is single.

18. The light emitting device according to claim 17, wherein the sealing member is configured to form an upper surface where a partial area being parallel to a surface of the base member constitutes 70% or smaller of an entire upper surface of the sealing member.

19. The light emitting device according to claim 18, wherein the height difference of the sealing member between the first section and the second section is 50 to 70 µm.

20. The light emitting device according to claim 1, wherein said base member is made of ceramics.

21. The light emitting element according to claim 1, wherein a width of said anode and cathode wiring islands is 10% of the upper surface of said base member.

22. A light emitting device comprising:
a base member;
anode and cathode wiring portions arranged on the base member;
a light emitting element that is arranged on an upper surface of said base member and is electrically connected to each of said anode and cathode wiring portions by wires; and
a sealing member that covers said light emitting element, at least a part of said base member, and said anode and cathode wiring portions, and includes a wavelength conversion member,
wherein the part of said base member and said anode and cathode wiring portions, which are covered by said sealing member, are divided into first and second sections by an imaginary straight line that passes through the center of the part as viewed in plan view,
wherein said anode and cathode wiring portions are arranged so that the area of said anode and cathode wiring portions in said first section is larger than in said second section,
wherein said light emitting element is arranged so that the area of the light emitting element in said second section is larger than in said first section and the light emitting element is arranged away from said anode and cathode wiring portions on said base member as viewed in plan view,
wherein the height of said sealing member on said second section side is greater than on said first section side,
wherein said sealing member has a constant height in an x direction parallel to a first imaginary straight line that passes through the center,
wherein said sealing member is arranged symmetrically with respect to a second imaginary straight line that passes through the center and perpendicular to said first imaginary straight line, and
wherein a height of the sealing member in said second section is greater than that of the sealing member in said first section in a y direction parallel to said second imaginary line so that the sealing member is inclined from one end to the other end of said base member in the y direction.

23. The light emitting device according to claim 1, wherein said light emitting element is arranged so that the light emitting element does not overlap the electrically-conductive members of said anode and cathode wiring islands on said base member as viewed in plan view.

24. The light emitting device according to claim 1, wherein a part where said sealing member reaches a maximum height does not overlap with said light emitting element as viewed in plan view.

25. The light emitting device according to claim 1, wherein the straight line that passes through the center of said sealing member as viewed in plan view is a horizontal line.

26. The light emitting device according to claim 22, wherein a part where said sealing member reaches a maximum height does not overlap with said light emitting element as viewed in plan view.

27. The light emitting device according to claim 22, wherein the straight line that passes through the center of said sealing member as viewed in plan view is a horizontal line.

\* \* \* \* \*